United States Patent
Hung

(10) Patent No.: US 11,792,572 B2
(45) Date of Patent: Oct. 17, 2023

(54) AUDIO SIGNAL PROCESSING CIRCUIT AND AUDIO SIGNAL PROCESSING METHOD

(71) Applicant: REALTEK SEMICONDUCTOR CORPORATION, Hsinchu (TW)

(72) Inventor: Tien-Chiu Hung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/568,304

(22) Filed: Jan. 4, 2022

(65) Prior Publication Data
US 2022/0312113 A1    Sep. 29, 2022

(30) Foreign Application Priority Data
Mar. 24, 2021   (TW) .................. 110110708

(51) Int. Cl.
*H04R 3/04* (2006.01)
*H03G 3/30* (2006.01)

(52) U.S. Cl.
CPC ............. *H04R 3/04* (2013.01); *H03G 3/3005* (2013.01); *H04R 2430/01* (2013.01); *H04R 2430/03* (2013.01)

(58) Field of Classification Search
CPC .. H04R 3/04; H04R 2430/01; H04R 2430/03; H04R 25/356; H03G 3/00; H03G 5/005; H03G 5/025; H03G 5/165

USPC .... 381/321, 98, 99, 102, 103, 104, 107, 109
See application file for complete search history.

(56) References Cited

U.S. PATENT DOCUMENTS

| | | | |
|---|---|---|---|
| 7,676,043 B1 | 3/2010 | Tsutsui et al. | |
| 7,729,497 B2 | 6/2010 | Van Reck | |
| 8,275,152 B2 | 9/2012 | Smirnov et al. | |
| 9,319,789 B1 | 4/2016 | Nielsen | |
| 9,729,969 B2 | 8/2017 | Risberg | |
| 2009/0052695 A1* | 2/2009 | Yamada | H03G 9/025 381/101 |
| 2009/0080675 A1* | 3/2009 | Smirnov | H03G 5/165 381/98 |
| 2018/0192193 A1* | 7/2018 | Chao | H04R 3/00 |
| 2019/0141441 A1 | 5/2019 | Yang et al. | |

* cited by examiner

*Primary Examiner* — Xu Mei
(74) *Attorney, Agent, or Firm* — WPAT, P.C

(57) ABSTRACT

An audio signal processing circuit includes a filter, a gain control circuit, and a bass boost circuit. The filter filters an audio signal and produces a filtered signal accordingly. The gain control circuit divides the filtered signal in the time domain into a first segment and a second segment that are substantially equal in length, measures a first amplitude of the first segment and a second amplitude of the second segment, and generates a gain based on the first amplitude which is greater than the second amplitude. The bass boost circuit adjusts the amplitudes of the first segment and the second segment according to the gain.

9 Claims, 8 Drawing Sheets

AUDIO SIGNAL PROCESSING CIRCUIT AND AUDIO SIGNAL PROCESSING METHOD

BACKGROUND OF THE INVENTION

1. Field of the Invention

The present invention generally relates to audio processing, and, more particularly, to low-frequency audio signal processing.

2. Description of Related Art

As the speakers of modern electronic devices are getting smaller and smaller in physical size, the users are becoming unsatisfied with the quality of the sounds that the audio playback system outputs, especially the low-frequency sounds because the miniatured speakers constrain the reproduction of the low-frequency signals.

An intuitive solution is to increase the low-frequency energy. However, the energy in the low-frequency band must not be too high because excessively high energy may cause damage to the speakers or, as a consequence of reducing the overall signal energy together for the purpose of reducing the energy in the low-frequency band in order to avoid damage to the speakers, cause the energy in the medium high frequency band(s) to be suppressed (i.e., the amplitude(s) of the medium high frequency band(s) become(s) smaller).

Therefore, improving the user's listening experience of low-frequency signals in a more effective manner has become an important issue in this technical field.

SUMMARY OF THE INVENTION

In view of the issues of the prior art, an object of the present invention is to provide an audio signal processing circuit and an audio signal processing method, so as to make an improvement to the prior art.

According to one aspect of the present invention, an audio signal processing circuit is provided. The audio signal processing circuit includes a filter, a gain control circuit, and a bass boost circuit. The filter is configured to filter an audio signal to produce a filtered signal. The gain control circuit is coupled to the filter and configured to divide the filtered signal in the time domain into a first segment and a second segment that are substantially equal in length, to measure a first amplitude of the first segment and a second amplitude of the second segment, and to generate a gain based on the first amplitude which is greater than the second amplitude. The bass boost circuit is coupled to the filter and the gain control circuit and configured to adjust amplitudes of the first segment and the second segment according to the gain.

According to another aspect of the present invention, an audio signal processing circuit is provided. The audio signal processing circuit includes a first filter, a second filter, a gain control circuit, a bass boost circuit, a third filter, a non-linear processing circuit, a fourth filter, a delay circuit, and an adder circuit. The first filter is configured to filter an audio signal to produce a first filtered signal. The second filter is configured to filter the audio signal to produce a second filtered signal. The gain control circuit is coupled to the first filter and configured to divide the first filtered signal in the time domain into a first segment and a second segment that are substantially equal in length, to measure a first amplitude of the first segment and a second amplitude of the second segment, and to generate a gain based on the first amplitude which is greater than the second amplitude. The bass boost circuit is coupled to the second filter and the gain control circuit and configured to adjust the second filtered signal according to the gain to generate an intermediate signal. The third filter is coupled to the bass boost circuit and configured to filter the intermediate signal to produce a third filtered signal. The non-linear processing circuit is coupled to the bass boost circuit and configured to process the intermediate signal to generate a harmonic signal. The fourth filter is coupled to the non-linear processing circuit and configured to filter the harmonic signal to produce a fourth filtered signal. The delay circuit is coupled to the third filter and configured to delay the third filtered signal to generate a delayed signal. The adder circuit is coupled to the delay circuit and the fourth filter and configured to add the fourth filtered signal and the delayed signal to generate an output signal.

According to still another aspect of the present invention, an audio signal processing method is provided. The audio signal processing method includes the following steps: dividing a signal in the time domain into a plurality of segments; determining a segment group based on acoustic characteristics of the signal in the segments, wherein the segment group includes a plurality of target segments that are substantially equal in length; measuring amplitudes of the signal in the target segments to determine a characteristic amplitude of the segment group; generating at least one gain according to the characteristic amplitude; and adjusting the amplitudes of the signal in the target segments according to the at least one gain.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an audio signal processing circuit and audio signal processing method. On account of that some or all elements of the audio signal processing circuit could be known, the detail of such elements is omitted provided that such detail has little to do with the features of this disclosure, and that this omission nowhere dissatisfies the specification and enablement requirements. Some or all of the processes of the audio signal processing method may be implemented by software and/or firmware, and can be performed by the audio signal processing circuit or its equivalent. A person having ordinary skill in the art can choose components or steps equivalent to those described in this specification to carry out the present invention, which means that the scope of this invention is not limited to the embodiments in the specification.

Figure 1:
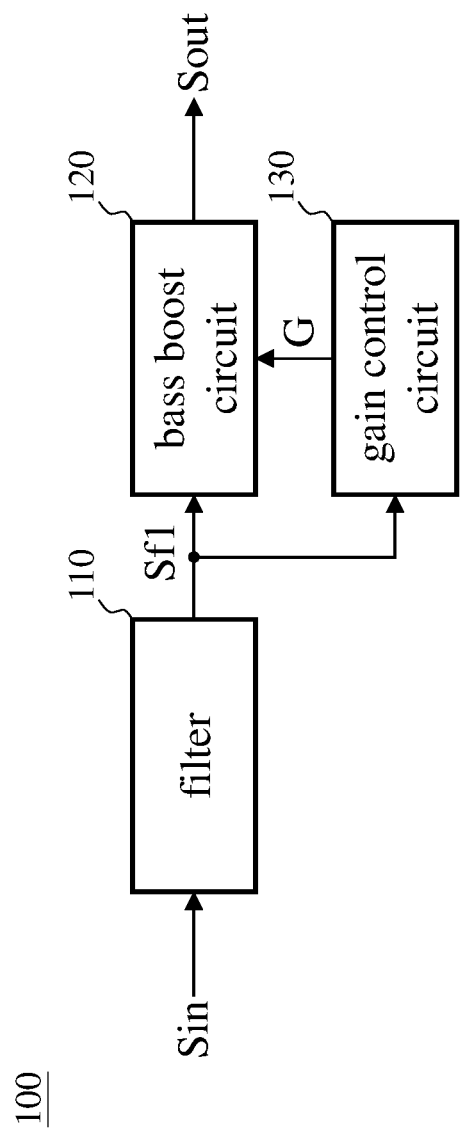
FIG. 1 illustrates a functional block diagram of the audio signal processing circuit according to an embodiment of the present invention.

FIG. 1 is a functional block diagram of the audio signal processing circuit according to an embodiment of the present invention. The audio signal processing circuit 100 includes a filter 110, a bass boost circuit 120, and a gain control circuit 130. The filter 110 filters the audio signal Sin to produce a filtered signal Sf1. The filtered signal Sf1 is the low-frequency component of the audio signal Sin, that is, the filter 110 may be a band-pass filter or a low-pass filter. The gain control circuit 130 generates the gain G according to multiple segments of the filtered signal Sf1 in the time domain, and the bass boost circuit 120 scales the filtered signal Sf1 based on the gain G to generate the output signal Sout.

Figure 2:
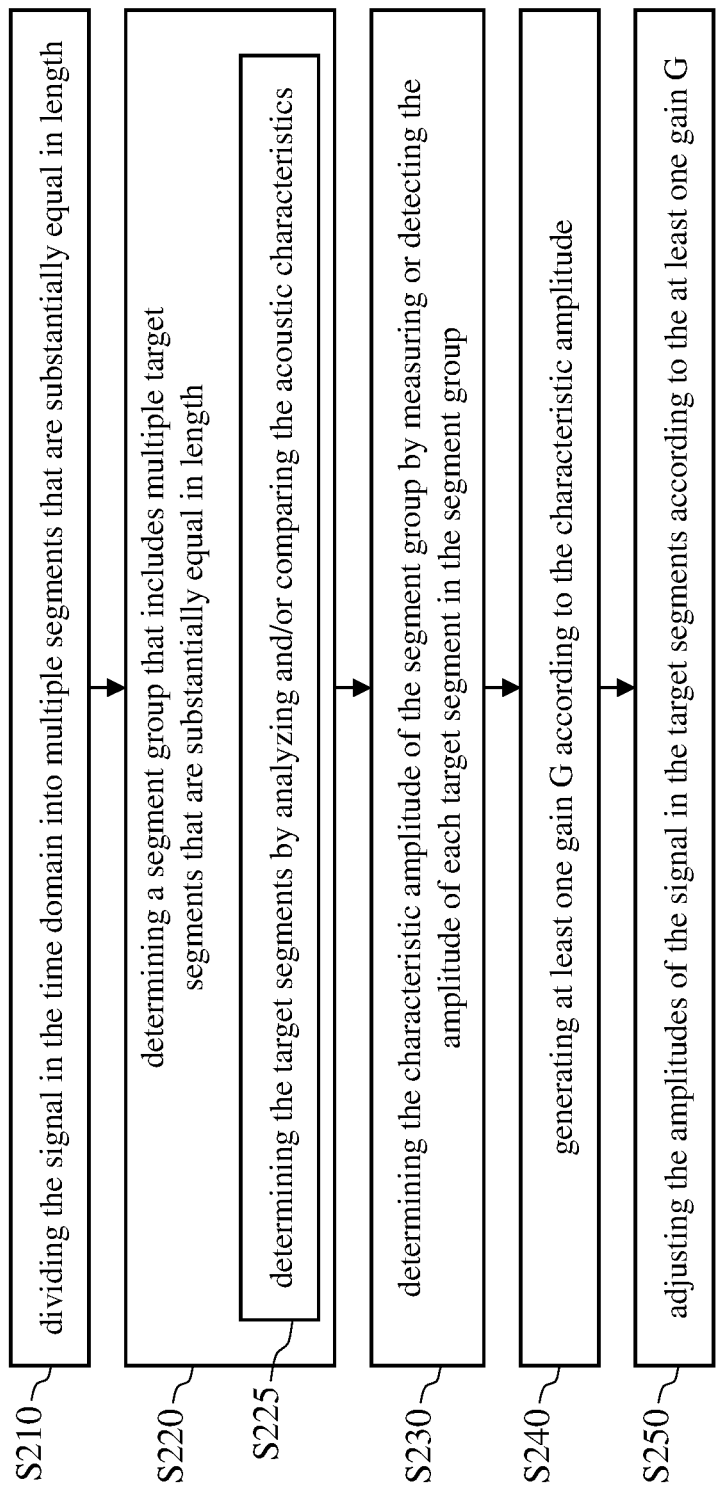
FIG. 2 illustrates a flowchart of the audio signal processing method according to an embodiment of the present invention.

Reference is made to FIG. 2, which is a flowchart of the audio signal processing method according to an embodiment of the present invention. The flow of FIG. 2 is performed by the bass boost circuit 120 and the gain control circuit 130 and includes the following steps.

Figure 3:
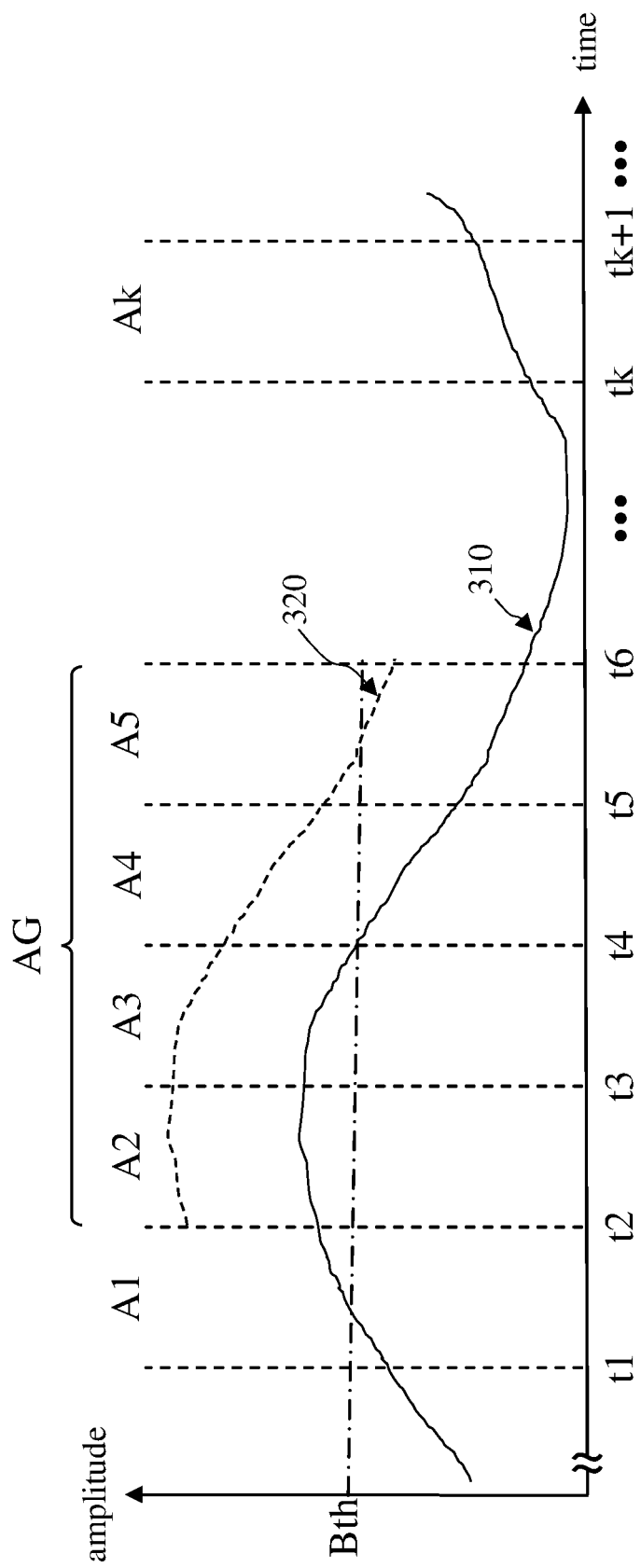
FIG. 3 illustrates the amplitude-time diagram of the filtered signal Sf1.

Step S210: dividing, by the gain control circuit 130, the filtered signal Sf1 (i.e., the low-frequency part of the audio signal Sin) in the time domain into multiple segments that are substantially equal in length. Reference is made to FIG. 3, which is an amplitude-time diagram of the filtered signal Sf1. As shown in FIG. 3, the filtered signal Sf1 is divided in the time domain by the gain control circuit 130 into multiple segments (including the segment A1 between the time point t1 and the time point t2, the segment A2 between the time point t2 and the time point t3, . . . , the segment Ak between the time point tk and the time point tk+1, . . . , where k is a positive integer). The segments are substantially equal in length (i.e., t2−t1=t3−t2=t4−t3= . . . =tk+1−tk).

Step S220: determining, by the gain control circuit 130, a segment group that includes multiple target segments. Step S220 includes sub-step S225: determining, by the gain control circuit 130, the target segments in the segment group by analyzing and/or comparing the acoustic characteristics (e.g., frequency components, timbre, and time envelope), the target segments having identical or similar frequency distributions or frequency components. In some embodiments, the gain control circuit 130 analyzes the frequency components of the filtered signal Sf1 in each segment, and selects the segments containing one or more target frequency bands as the target segments. For example, if the target frequency bands are 30 to 50 Hz and 80 to 95 Hz, when the segment A1 and the segment A2 have signal components in both the frequency band 30 to 50 Hz and the frequency band 80 to 95 Hz, the gain control circuit 130 classifies the segment A1 and the segment A2 into the same segment group (i.e., selects the segment A1 and the segment A2 as the target segments).

Because all target segments in a certain segment group are identical or similar in terms of frequency components, the segment group may correspond to signals of the same timbre. Even though the frequency spectrum distributions of a certain pitch are quite similar in the musical presentation, this pitch, when made by different instruments (such as the electric guitar, trumpet, and timpani), presents different frequency component proportions, which explains why the human can distinguish between timbres from different sound sources. Therefore, the segments with different timbres should be separated into different segment groups.

The following discussions are made based on the example in which the segment group AG includes the segment A2, the segment A3, the segment A4, and the segment A5 (i.e., the segments A2 to A5 are the target segments).

Step S230: determining, by the gain control circuit 130, the characteristic amplitude of the segment group by measuring or detecting the amplitude of each target segment in the segment group. Continuing the above example, by measuring the amplitudes of the segments A2 to A5, the gain control circuit 130 obtains the amplitudes B2 (maximum in the segment) to B5 (maximum in the segment) corresponding respectively to the segments A2 to A5 and then takes the largest of the amplitudes B2 to B5 as the characteristic amplitude of the segment group AG. It is understood that taking the largest amplitude in the segment group can be a dynamic concept, so that real-time gain adjustment can be carried out. For example, in other embodiments in which the amplitudes of the segments A2 to A5 are initially in the order of B3>B2>B4>B5, as time progresses, the largest amplitude at the time point t3 (after the segment A2) is amplitude B2; at the time point t4 (after the segment A3), the recorded largest amplitude is amplitude B3; and as time further progresses to the time point t5 (after the segment A4) and time point t6 (after the segment A5), the recorded largest amplitude of the segment group is still amplitude B3 (i.e., as time progresses and after the time of at least two target segments has elapsed, the "largest recorded amplitude" can be obtained according to the target segments that have passed by, and the amplitude B3 in the above embodiment is the type of "local largest amplitude" in the segment group).

Step S240: generating, by the gain control circuit 130, at least one gain G according to the characteristic amplitude. In some embodiments, the gain control circuit 130 uses the ratio of the characteristic amplitude to the amplitude of the target segment as the gain G. For example, continuing the above example, if, among the segments A2 to A5, the segment A3 has the largest amplitude B3 (i.e., the characteristic amplitude is B3), then the gains G corresponding to the segments A2, A4, and A5 are B2/B2, B3/B4 and B3/B5, respectively. In other embodiments, the gain control circuit 130 uses a look-up table, which is stored in memory, to determine the gain G according to the characteristic amplitude, and the gain G can be used for all target segments in the segment group (i.e., the gain G is determined according to the "local largest amplitude").

Step S250: adjusting, by the bass boost circuit 120, the amplitudes B2 to B5 of the filtered signal Sf1 in the target segments A2 to A5 according to the at least one gain G. In some embodiments, the bass boost circuit 120 boosts the amplitudes in the segments A2 to A5 by multiplying the sample-based amplitudes B2 to B5 of the segments A2 to A5 by the gain G. In other words, after being processed by the bass boost circuit 120, the filtered signal Sf1 is correspondingly boosted in amplitude or energy within the time period corresponding to the segment group AG (i.e., between the time points t2 and t6). As mentioned above, the manner in which the gain control circuit 130 generates the gain G according to the characteristic amplitude is not limited to this. When the real-time gain adjustment method is adopted, as time progresses, the gain control circuit 130 can generate the gain G according to the "recorder largest amplitude" instead of the "local largest amplitude." Therefore, the gain G may also change over time. In addition, the gain adjustment method is not limited to this. In addition to the overall adjustment of the gain G, the bass boost circuit 120 can also adjust the individual amplitude of each segment. In some embodiments, if the bass boost circuit 120 makes additional gain adjustments to the characteristic amplitude itself (e.g., with the gain α, which is the gain of the global maximum amplitude), the filtered signal Sf1 can be booted higher (but not limited) in amplitude or energy within the time period of the segment group AG. For example, if a gain of B2*α is applied to the characteristic amplitude B2, the boosted amplitudes corresponding to the segment A3, segment A4 and segment A5 will become B2*α/B3, B2*α/B4 and B2*α/B5, respectively.

In summary, the audio signal processing circuit 100 can appropriately boost the low-frequency part of the audio signal Sin (i.e., the filtered signal Sf1), so that the low-frequency part of the audio signal Sin that is small in energy can exceed the users' hearing threshold Bth (i.e., the users can feel the low-frequency sound more easily), and the relative amplitude relationship of the same segment group signals can still be maintained. As shown in FIG. 3, the amplitude of the filtered signal Sf1 that has not yet been processed by the bass boost circuit 120 (curve 310) is less than the threshold Bth in the segment A4 and segment A5 (i.e., the user cannot feel the low-frequency sound after the time point t4), but the amplitude of the filtered signal Sf1 that has been processed by the bass boost circuit 120 (curve 320) is greater than the threshold Bth between the time point t4 and the time point t5. In other words, after being processed, the dynamic range of the audio signal Sin changes at a slower speed from large to small (i.e., sound attenuation slower). Therefore, users can feel stronger and longer-lasting low-frequency sounds (i.e., the user can feel a more pronounced low-frequency effect).

In some embodiments, the artificial intelligence (AI, such as neural networks) can be trained to assist in the determination of the similarity between frequency spectrums or frequency components in the sub-step S225.

In some embodiments, for a segment that does not belong to any segment group (i.e., this segment is not a target segment), the gain control circuit 130 sets the gain G of this segment to one (i.e., the bass boost circuit 120 does not amplify the amplitude of this segment), or determines the gain G by looking up in the look-up table according to the value of each segment.

In some embodiments, the bass boost circuit 120 is a signal amplifier that amplifies the filtered signal Sf1 by the gain G to generate the output signal Sout.

Figure 4:
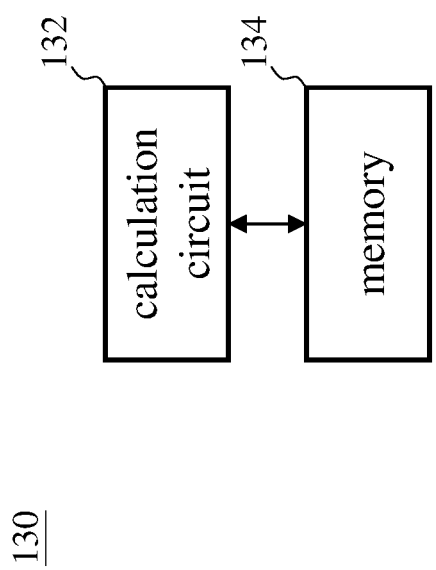
FIG. 4 illustrates a functional block diagram of the gain control circuit according to an embodiment of the present invention.

In some embodiments, as shown in FIG. 4, the gain control circuit 130 includes a calculation circuit 132 and a memory 134. The calculation circuit 132 can be a circuit or electronic component with program execution capability, such as a central processing unit, a microprocessor, a micro-controller, a micro processing unit, a digital signal processor (DSP), or their equivalent. The calculation circuit 132 performs the steps of FIG. 2 by executing the program codes or program instructions stored in the memory 134. In other embodiments, people having ordinary skill in the art can design the gain control circuit 130 based on the above discussions. That is to say, the gain control circuit 130 can be an application specific integrated circuit (ASIC) or embodied by circuits or hardware such as a programmable logic device (PLD).

Figure 5:
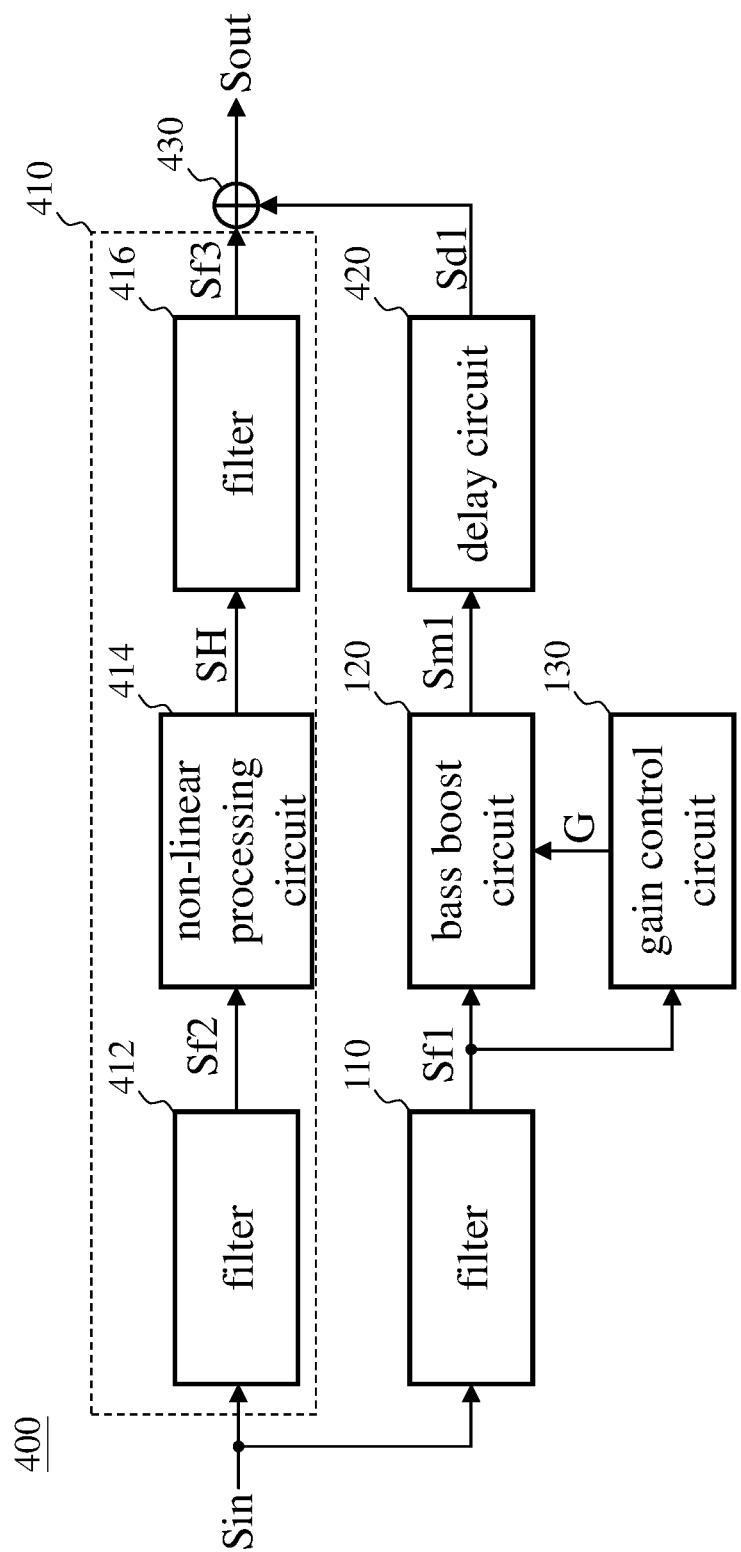
FIG. 5 illustrates a functional block diagram of the audio signal processing circuit according to another embodiment of the present invention.

The audio signal processing circuit 100 can be combined with a virtual bass circuit. FIG. 5 is a functional block diagram of the audio signal processing circuit according to another embodiment of the present invention. The audio signal processing circuit 400 includes the filter 110, the bass boost circuit 120, the gain control circuit 130, a virtual bass circuit 410, a delay circuit 420, and an adder circuit 430. The virtual bass circuit 410 includes a filter 412, a non-linear processing circuit 414, and a filter 416.

The filter 412 filters the audio signal Sin to produce a filtered signal Sf2. The filter 412 is a low-pass filter or a band-pass filter, and the frequency range of the filtered signal Sf2 is a frequency part which are inefficient to be reproduced by a loudspeaker. The non-linear processing circuit 414 processes the filtered signal Sf2 to generate a harmonic signal SH. For example, the harmonic signal SH may include harmonics of 200 Hz, 300 Hz, 400 Hz, and 500 Hz. The filter 416 filters the harmonic signal SH to produce a filtered signal Sf3. The filter 416 may be a band-pass filter that filters out unwanted harmonics in the harmonic signal SH; for example, if the filter 416 filters out the harmonics above 500 Hz, then the filtered signal Sf3 will have harmonics of only 200 Hz, 300 Hz, and 400 Hz. The delay circuit 420 delays the intermediate signal Sm1 generated by the bass boost circuit 120 and generates a delayed signal $Sd^1$ that is aligned in time with the filtered signal Sf3. The adder circuit 430 adds the filtered signal Sf3 and the delayed signal Sd1 to generate the output signal Sout.

The virtual bass circuit 410 operates based on psycho-acoustic technique, which demonstrates the existence of a phenomenon in harmonics known as "virtual pitch", in which the brain senses a frequency in the lowest common factor in harmonic frequencies, even if the amplitude of the fundamental frequency is zero The non-linear processing circuit 414 is well known to people having ordinary skill in the art. For more details, please refer to the U.S. Pat. No. 8,416,965 which is entitled "harmonics generation apparatus and method thereof" and U.S. Pat. No. 8,615,093 which is entitled "apparatus and method for processing audio signal".

Figure 6:
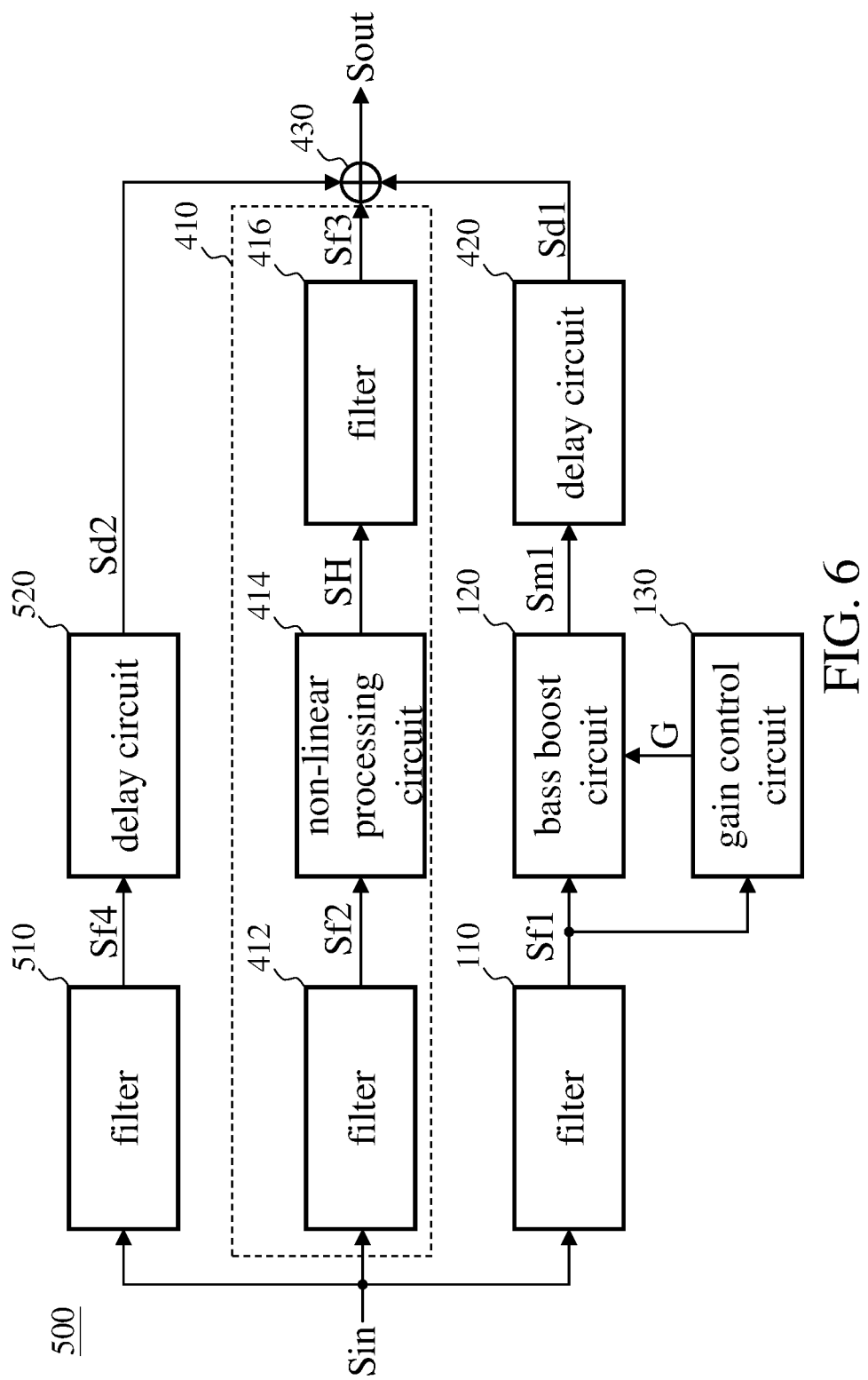
FIG. 6 illustrates a functional block diagram of the audio signal processing circuit according to another embodiment of the present invention.

FIG. 6 is a functional block diagram of the audio signal processing circuit according to another embodiment of the present invention. The audio signal processing circuit 500 includes the filter 110, the bass boost circuit 120, the gain control circuit 130, the virtual bass circuit 410, the delay circuit 420, the adder circuit 430, a filter 510, and a delay circuit 520. The filter 510 filters the audio signal Sin to produce the filtered signal Sf4. The filter 510 can be a high-pass filter for removing the low-frequency parts which are not efficient to be reproduced by the speaker (i.e., the filtered signal Sf4 is the medium frequency parts and high frequency parts of the audio signal Sin). The delay circuit 520 delays the filtered signal Sf4 to generate a delayed signal Sd2 that is time aligned with the filtered signal Sf3. The adder circuit 430 adds the delayed signal Sd2, the filtered signal Sf3, and the delayed signal Sd1 to generate the output signal Sout.

Figure 7:
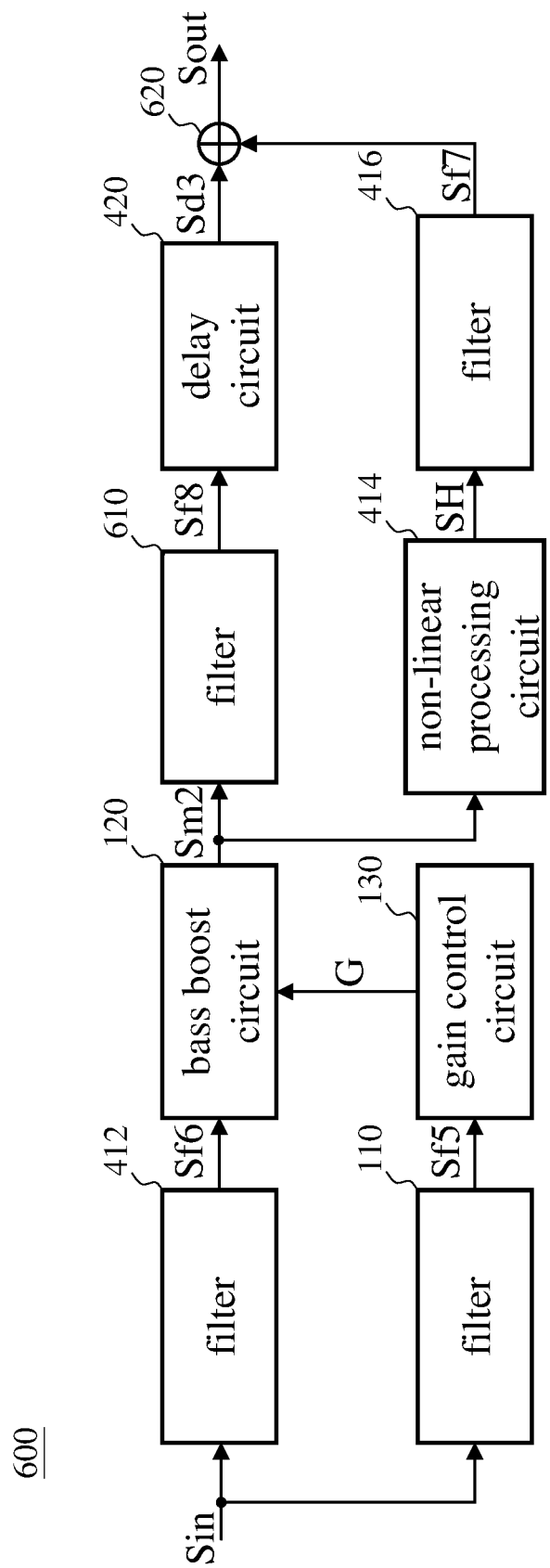
FIG. 7 illustrates a functional block diagram of the audio signal processing circuit according to another embodiment of the present invention.

FIG. 7 is a functional block diagram of the audio signal processing circuit according to another embodiment of the present invention. The audio signal processing circuit 600 includes the filter 110, the bass boost circuit 120, the gain control circuit 130, the filter 412, the non-linear processing circuit 414, the filter 416, the delay circuit 420, a filter 610, and an adder circuit 620. The filter 110 filters the audio signal Sin to produce the filtered signal Sf5. The filtered signal Sf5 is the low-frequency parts of the audio signal Sin. The filter 412 filters the audio signal Sin to produce a filtered signal Sf6. The gain control circuit 130 generates the gain G according to multiple segments of the filtered signal Sf5 in the time domain, and the bass boost circuit 120 amplifies the filtered signal Sf6 according to the gain G to generate the intermediate signal Sm2. The non-linear processing circuit 414 generates the harmonic signal SH of the intermediate signal Sm2. The filter 416 filters the harmonic signal SH to produce a filtered signal Sf7. The filter 610 extracts a suitable part from the intermediate signal Sm2 (the harmonic generation frequency range may be different from the enhanced range; in some embodiments, the filter 610 is an optional component) to produce the filtered signal Sf8. The delay circuit 420 delays the filtered signal Sf8 and generates a delayed signal Sd3 that is aligned in time with the filtered signal Sf7. The adder circuit 620 adds the filtered signal Sf7 and the delayed signal Sd3 to generate the output signal Sout.

Figure 8:
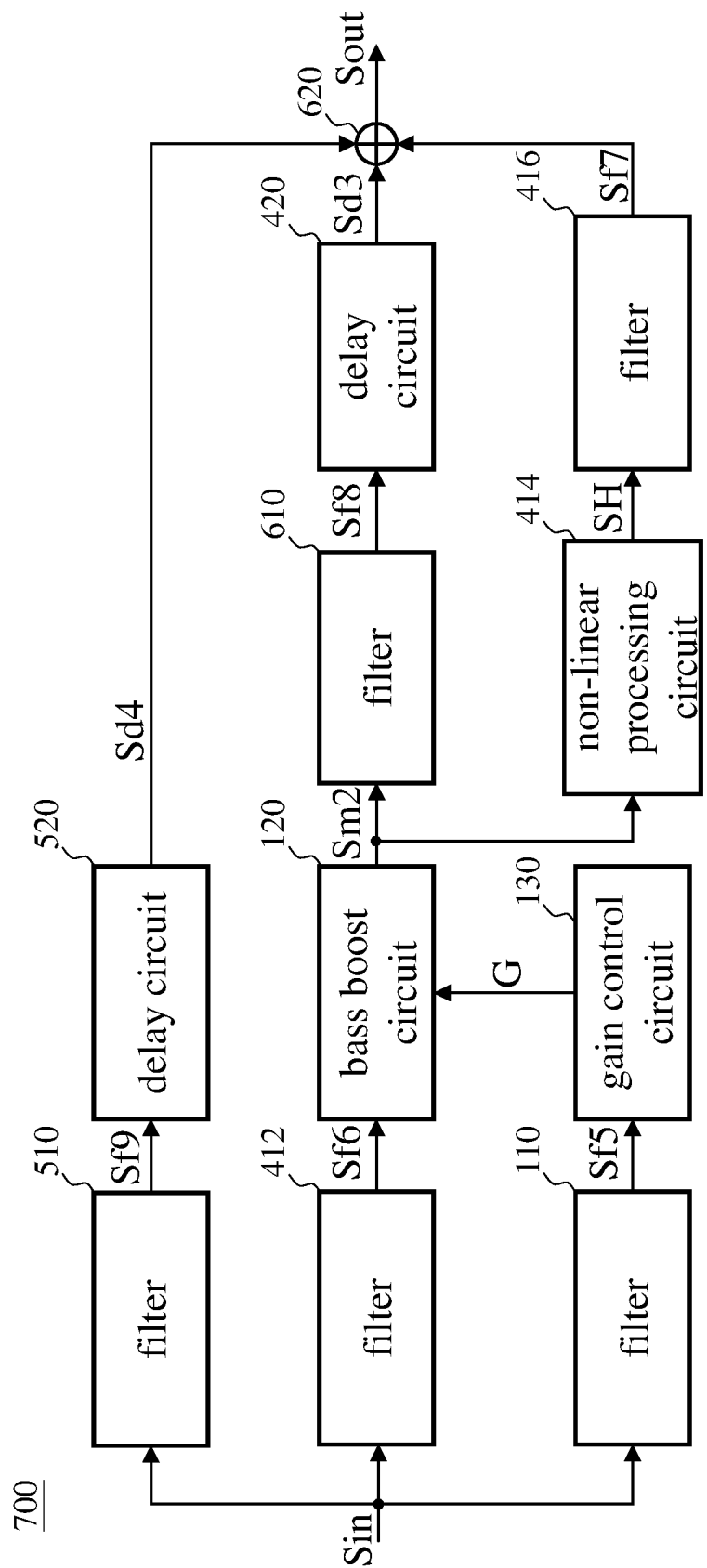
FIG. 8 illustrates a functional block diagram of the audio signal processing circuit according to another embodiment of the present invention.

FIG. 8 is a functional block diagram of the audio signal processing circuit according to another embodiment of the present invention. The audio signal processing circuit 700 includes the filter 110, the bass boost circuit 120, the gain control circuit 130, the filter 412, the non-linear processing circuit 414, the filter 416, the delay circuit 420, the filter 510, the delay circuit 520, the filter 610, and an adder circuit 620. The filter 510 filters the audio signal Sin to produce a filtered signal Sf9 which is the medium frequency part and high frequency part of the audio signal Sin. The delay circuit 520 delays the filtered signal Sf9 to generate a delayed signal Sd4 that is time aligned with the filtered signal Sf7. The adder circuit 620 adds the delayed signal Sd4, the filtered signal Sf7, and the delayed signal Sd3 to generate the output signal Sout.

According to the present invention, the audio signal processing circuit and the audio signal processing method can adaptively adjust the amplitude(s) of the low-frequency component of the audio signal. In comparison with the prior art, the present invention improves the user's listening experience of low-frequency signals.

Since a person having ordinary skill in the art can appreciate the implementation detail and the modification thereto of the present method invention through the disclosure of the device invention, repeated and redundant description is thus omitted. Please note that the shape, size, and ratio of any element in the disclosed figures are exemplary for understanding, not for limiting the scope of this invention. Furthermore, there is no step sequence limitation for the method inventions as long as the execution of each step is applicable. In some instances, the steps can be performed simultaneously or partially simultaneously.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An audio signal processing circuit, comprising:
    a filter for filtering an audio signal to produce a filtered signal;
    a gain control circuit, coupled to the filter, for dividing the filtered signal in the time domain into a first segment and a second segment that are substantially equal in length, measuring a first amplitude of the first segment and a second amplitude of the second segment, and generating a gain based on the first amplitude which is greater than the second amplitude; and
    a bass boost circuit, coupled to the filter and the gain control circuit, for adjusting amplitudes of the first segment and the second segment according to the gain.

2. The audio signal processing circuit of claim 1, wherein the gain control circuit performs spectrum analysis on the first segment and the second segment, and the first segment and the second segment have identical or similar frequency distributions.

3. The audio signal processing circuit of claim 1, wherein the filter is a first filter, the filtered signal is a first filtered signal, and the bass boost circuit generates an intermediate signal, the audio signal processing circuit further comprising:
    a second filter for filtering the audio signal to produce a second filtered signal;
    a non-linear processing circuit, coupled to the second filter, for processing the second filtered signal to generate a harmonic signal;
    a third filter, coupled to the non-linear processing circuit, for filtering the harmonic signal to produce a third filtered signal;
    a delay circuit, coupled to the bass boost circuit, for delaying the intermediate signal to generate a delayed signal; and
    an adder circuit, coupled to the third filter and the delay circuit, for adding the third filtered signal and the delayed signal to generate an output signal.

4. The audio signal processing circuit of claim 1, wherein the filter is a first filter, the filtered signal is a first filtered signal, and the bass boost circuit generates an intermediate signal, the audio signal processing circuit further comprising:
    a second filter for filtering the audio signal to produce a second filtered signal;
    a non-linear processing circuit, coupled to the second filter, for processing the second filtered signal to generate a harmonic signal;
    a third filter, coupled to the non-linear processing circuit, for filtering the harmonic signal to produce a third filtered signal;
    a first delay circuit, coupled to the bass boost circuit, for delaying the intermediate signal to generate a first delayed signal;
    a fourth filter for filtering the audio signal to produce a fourth filtered signal;
    a second delay circuit, coupled to the fourth filter, for delaying the fourth filtered signal to generate a second delayed signal; and
    an adder circuit, coupled to the third filter, the first delay circuit, and the second delay circuit, for adding the third filtered signal, the first delayed signal, and the second delayed signal to generate an output signal.

5. An audio signal processing circuit, comprising:
    a first filter for filtering an audio signal to produce a first filtered signal;

a second filter for filtering the audio signal to produce a second filtered signal;

a gain control circuit, coupled to the first filter, for dividing the first filtered signal in the time domain into a first segment and a second segment that are substantially equal in length, measuring a first amplitude of the first segment and a second amplitude of the second segment, and generating a gain based on the first amplitude which is greater than the second amplitude;

a bass boost circuit, coupled to the second filter and the gain control circuit, for adjusting the second filtered signal according to the gain to generate an intermediate signal;

a third filter, coupled to the bass boost circuit, for filtering the intermediate signal to produce a third filtered signal;

a non-linear processing circuit, coupled to the bass boost circuit, for processing the intermediate signal to generate a harmonic signal;

a fourth filter, coupled to the non-linear processing circuit, for filtering the harmonic signal to produce a fourth filtered signal;

a delay circuit, coupled to the third filter, for delaying the third filtered signal to generate a delayed signal; and an adder circuit, coupled to the delay circuit and the fourth filter, for adding the fourth filtered signal and the delayed signal to generate an output signal.

6. The audio signal processing circuit of claim 5, wherein the gain control circuit performs spectrum analysis on the first segment and the second segment, and the first segment and the second segment have identical or similar frequency distributions.

7. The audio signal processing circuit of claim 5, wherein the delay circuit is a first delay circuit, and the delayed signal is a first delayed signal, the audio signal processing circuit further comprising:

a fifth filter for filtering the audio signal to produce a fifth filtered signal; and a second delay circuit, coupled to the fifth filter, for delaying the fifth filtered signal to generate a second delayed signal;

wherein the adder circuit is further coupled to the second delay circuit, and the output signal further comprises the second delayed signal.

8. An audio signal processing method, comprising:

dividing a signal in the time domain into a plurality of segments;

determining a segment group based on acoustic characteristics of the signal in the segments, wherein the segment group comprises a plurality of target segments that are substantially equal length;

measuring amplitudes of the signal in the target segments to determine a characteristic amplitude of the segment group;

generating at least one gain according to the characteristic amplitude; and adjusting the amplitudes of the signal in the target segments according to the at least one gain.

9. The audio signal processing method of claim 8, wherein the step of determining the segment group based on the acoustic characteristics of the signal in the segments performs spectrum analysis on the segments, and the target segments have identical or similar frequency components.

* * * * *